(12) United States Patent
Jerominek

(10) Patent No.: US 6,780,570 B2
(45) Date of Patent: Aug. 24, 2004

(54) METHOD OF FABRICATING A SUSPENDED MICRO-STRUCTURE WITH A SLOPED SUPPORT

(75) Inventor: Hubert Jerominek, Ste-Foy (CA)

(73) Assignee: Institut National d'Optique, Quebec (CA)

( * ) Notice: Subject to any disclaimer, the term of this patent is extended or adjusted under 35 U.S.C. 154(b) by 148 days.

(21) Appl. No.: 09/888,989

(22) Filed: Jun. 25, 2001

(65) Prior Publication Data

US 2002/0018964 A1 Feb. 14, 2002

Related U.S. Application Data

(60) Provisional application No. 60/214,414, filed on Jun. 28, 2000.

(51) Int. Cl.[7] .............................. G03F 7/16; G03F 7/20; G03F 7/40
(52) U.S. Cl. ........................ 430/314; 430/323; 430/324
(58) Field of Search .......................... 430/314, 323–324

(56) References Cited

U.S. PATENT DOCUMENTS

| | | | | |
|---|---|---|---|---|
| 5,078,771 A | | 1/1992 | Wu ............................. 65/30.11 |
| 5,143,820 A | * | 9/1992 | Kotecha et al. ............. 430/314 |
| 5,310,623 A | | 5/1994 | Gal ............................. 430/321 |
| 5,334,467 A | | 8/1994 | Cronin et al. ................... 430/5 |
| 5,443,685 A | * | 8/1995 | Goossen et al. ............. 438/498 |
| 5,480,764 A | | 1/1996 | Gal et al. ................... 430/321 |
| 5,482,800 A | | 1/1996 | Gal ............................... 430/5 |
| 5,559,358 A | * | 9/1996 | Burns et al. ................. 257/431 |
| 5,744,284 A | * | 4/1998 | Laub et al. .................. 430/313 |
| 5,831,266 A | * | 11/1998 | Jerominek et al. ....... 250/338.4 |
| 5,841,143 A | * | 11/1998 | Tuma et al. ............. 250/458.1 |
| 5,955,817 A | * | 9/1999 | Dhuler et al. ............... 310/307 |
| 5,998,066 A | | 12/1999 | Block et al. ................... 430/5 |
| 6,033,766 A | | 3/2000 | Block et al. ................. 428/210 |
| 6,071,652 A | | 6/2000 | Feldman et al. ............... 430/5 |
| 6,107,000 A | | 8/2000 | Lee et al. .................... 430/296 |

* cited by examiner

Primary Examiner—Mark F. Huff
Assistant Examiner—J. Ruggles
(74) Attorney, Agent, or Firm—Merchant & Gould P.C.

(57) ABSTRACT

The method of fabricating a suspended microstructure with a sloped support, comprises the steps of (a) providing a member having three stacked up layers including a first substrate layer, a second temporary layer and a third photoresist layer; (b) photolithographically transferring a sloped pattern to the third photoresist layer by means of a grey scale mask; (c) etching the second layer through the third layer resulting from step (b) to obtain a surface with at least one continuous slope with a predetermined angle with respect to the first substrate layer; (d) depositing a fourth layer on the previous layers; (e) etching the fourth layer to obtain the sloped support; (f) (i) depositing a fifth planarization layer, (ii) depositing a sixth layer, and (iii) etching the sixth layer; and (g) removing the second layer and the fifth layer to obtain the suspended microstructure with the sloped support. The invention is also concerned with a suspended microstructure fabricated by the method.

17 Claims, 9 Drawing Sheets

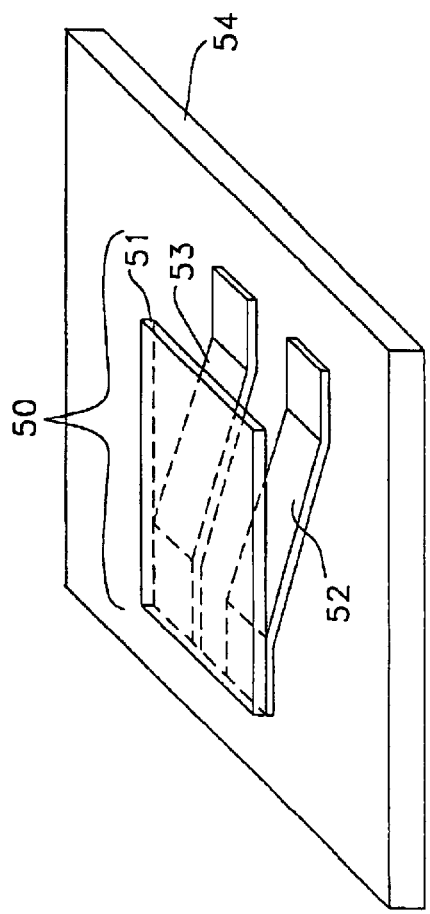
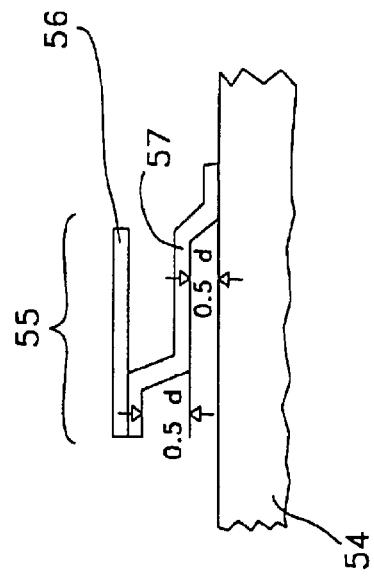
FIG. 8 (PRIOR ART)
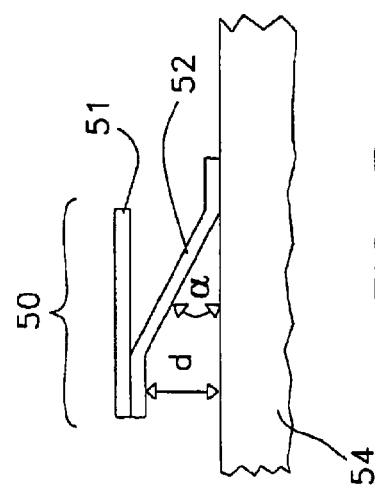
FIG. 7
FIG. 6

METHOD OF FABRICATING A SUSPENDED MICRO-STRUCTURE WITH A SLOPED SUPPORT

This application claims benefit of provisional application Ser. No. 60/214,414 filed on Jun. 28, 2000.

FIELD OF THE INVENTION

The present invention relates to a method of fabricating a suspended microstructure with a sloped support, and to a suspended microstructure fabricated by the method. More specifically, the present invention is concerned with manufacturing of three-dimensional suspended microstructures equipped with support members. These microstructures include: microbeams, microplatforms, and more complex structures consisting of multiple microbeams and microplatforms. The mentioned three-dimensional suspended microstructures are part of such miniature devices as: sensors of radiation, temperature, pressure, flow, chemical and biological species, emitters of radiation and others. These miniature devices are often classified as Micro Electro Mechanical Systems (MEMS), Micro Opto Electro Mechanical Systems (MOEMS) or simply Micro Systems (MS). The microstructures listed above may also be part of various electronic Integrated Circuits (ICs).

In the standard binary photolithographic pattern generation process applied to manufacturing of electronic integrated circuits and other microdevices, a series of masking steps, exposure steps and etching steps are used. In this process, a photoresist is applied on top of a substrate and a series of binary masks consisting of transparent and opaque regions are used in sequence to produce the final pattern. The process involves applying a binary mask, exposing the photoresist through the mask, developing the binary pattern transferred from the binary mask to the photoresist, and then dry or wet etching of the substrate using the photoresist as a masking layer. This sequence of operations is repeated with a second binary mask. In order to generate more complex patterns, it is usually necessary to repeat this masking, exposing, developing, etching sequence several times making use of several binary masks and maintaining the required registration of the masks during the successive manufacturing sequences. An example of a binary mask photolithographic pattern transfer process is schematically shown in FIGS. 1A to 1F.

A different way of generating three-dimensional micropatterns consists of utilizing a so-called grey scale mask. A grey scale mask is a two-dimensional surface with varying optical transmittance. The variation of the optical transmittance represents three-dimensional information e.g., a height profile or depth pattern. The grey scale mask is used to transfer this three-dimensional information to a photoresist film deposited on a substrate by photoexposure and development, which leaves a modulated photoresist film thickness. The three-dimensional information now contained in the thickness modulated photoresist film may be subsequently transferred into the substrate by a known etching process, thereby creating the desired depth pattern in this substrate. The resulting processed substrate then contains, as a physical contour, the three-dimensional information that was originally represented by the variation of the optical transmittance of the grey scale mask. An example of a micropattern generation using a grey scale photomask is shown schematically in FIGS. 2A to 2C.

Several methods for the fabrication of grey scale masks are known in the art. U.S. Pat. No. 5,078,771 by Wu describes a method of making grey scale masks in a high energy beam sensitive glass article (HEBS glass article herein) comprising a body portion and an integral ion-exchanged surface layer containing a high concentration of silver ions. This surface layer becomes darkened upon exposure to high-energy beams without resorting to heat or other development steps. The high-energy beams used to expose the HEBS glass article include electron beams, various ion beams and laser beams. The HEBS glass articles are colorless and totally are transparent to actinic radiation before exposure to high-energy beams and not darkened by actinic radiation at intensities within, above and/or below those commonly used in photolithography. Actinic radiation is defined herein as radiation in the wavelength range of ultraviolet and/or longer wavelengths. The image recorded in the HEBS glass article with a high energy beam as well as the unexposed transparent area of the glass are stable indefinitely in all possible thermal, lighting and humidity conditions.

U.S. Pat. No. 5,310,623 by Gal describes a grey scale mask constructed with a plurality of precisely located and sized light transmitting openings. The openings are formed with sufficiently small specific opening sizes and are located at a sufficiently large number of specific locations, which locations are correlated to related locations on the configuration of the designed grey scale image.

U.S. Pat. No. 5,334,467 by Cronin et al. describes a two-level grey scale mask. One level is constructed of a glass made partially transmissive by substitution of silver ions in place of metal ions of alkali metal silicates employed in the construction of the glass. The second level is made opaque by construction of the layer of a metal such as chromium.

U.S. Pat. No. 5,998,066 by Block et al. describes a method of producing a high-resolution grey scale mask using an inorganic chalcogenide glass, such as selenium germanium, coated with a thin layer of silver.

Applications of grey scale mask technology to manufacturing of various micro optical components have been proposed. U.S. Pat. No. 5,482,800 by Gal, U.S. Pat. No. 6,033,766 by Block et al. and U.S. Pat. No. 6,107,000 by Lee et al. describe fabrication of miniature diffractive optical components such as diffractive microlenses and gratings, and computer generated holograms by photolithography and etching making use of grey scale masks.

An application of the grey scale photomask technology to fabrication of optical refractive micro components is proposed in U.S. Pat. No. 6,071,652 by Feldman et al., while the application of the grey scale masks to manufacturing of optical guided-wave devices is proposed in U.S. Pat. No. 5,480,764 by Gal et al.

However, none of the above patents proposes a method of fabricating a suspended microstructure with a support having mechanical and electromechanical properties that can be precisely controlled.

SUMMARY OF THE INVENTION

It is an object of the present invention to provide a method of fabricating a suspended microstructure with a sloped support, and a suspended microstructure fabricated by said method where the mechanical and electromechanical properties of the support can be precisely controlled.

According to the present invention, there is provided a method of fabricating a suspended microstructure with a sloped support, comprising the steps of:

(a) providing a member having three stacked up layers including a first substrate layer, a second temporary layer and a third photoresist layer;

(b) photolithographically transferring a sloped pattern to the third photoresist layer by means of a grey scale mask;

(c) etching the second layer through the third layer resulting from step (b) to obtain a surface with at least one continuous slope with a predetermined angle with respect to the first surface layer;

(d) depositing a fourth layer on the previous layers;

(e) etching the fourth layer to obtain the sloped support; and (f) removing the second layer to obtain the microstructure with the sloped support.

According to a preferred embodiment, the method further comprises after step (e) and before step (f), steps of:

(i) depositing a fifth planarization layer for covering the previous layers except for a top portion of the sloped support;

(ii) depositing a sixth layer on the previous layers; and (iii) etching the sixth layer to obtain a microplatform;

wherein step (f) further includes a removal of the fifth layer.

BRIEF DESCRIPTION OF THE DRAWINGS

FIG. 6 is a perspective view of another suspended microstructure fabricated by the method according to the present invention.

FIG. 7 is a partial side view of a portion of the suspended microstructure shown in FIG. 6.

FIG. 8 is a partial side view of a suspended microstructure fabricated by a method of the prior art.

DESCRIPTION OF THE DRAWINGS

Figure 1A:
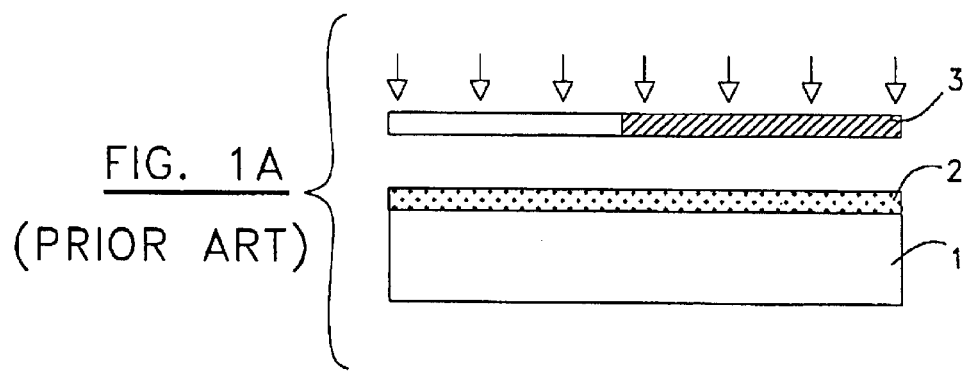
FIGS. 1A to 1F are schematic side views of the elements involved in each of the steps of a binary mask photolithographic pattern transfer process. Such process is known in the art.
Figure 1B:
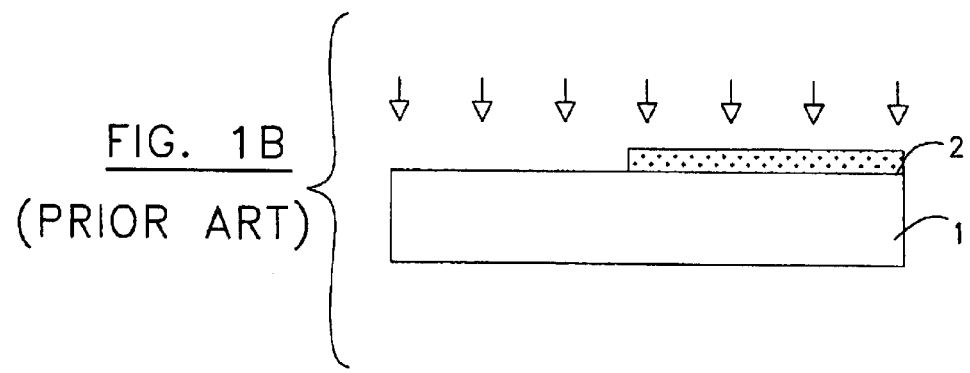
Figure 1C:
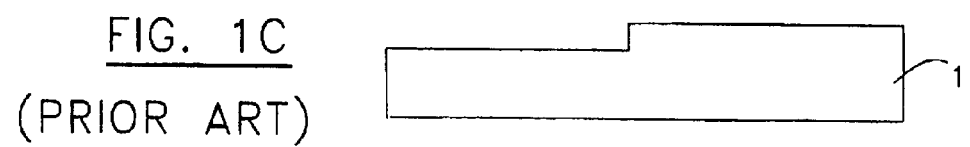
Figure 1D:
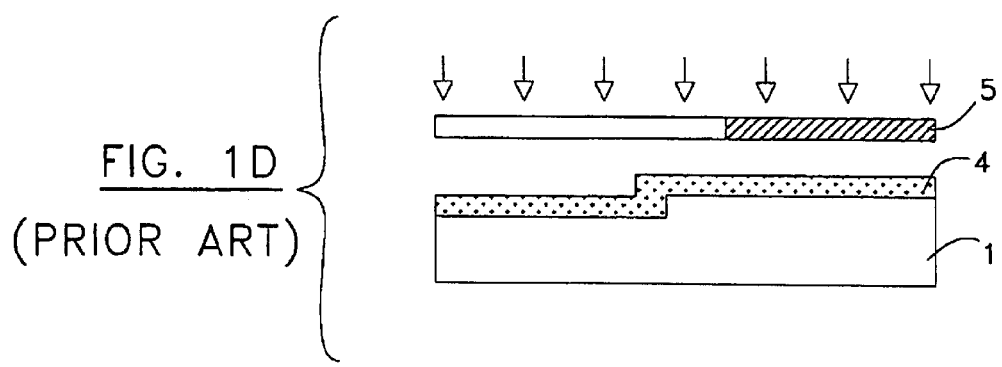
Figure 1E:
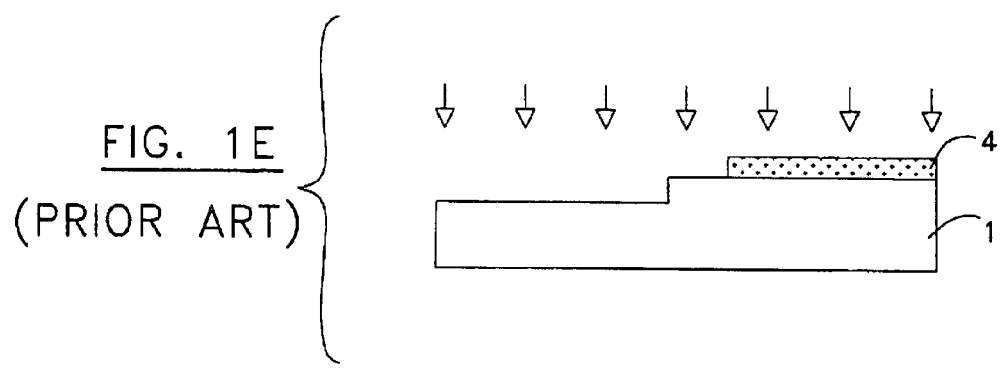
Figure 1F:
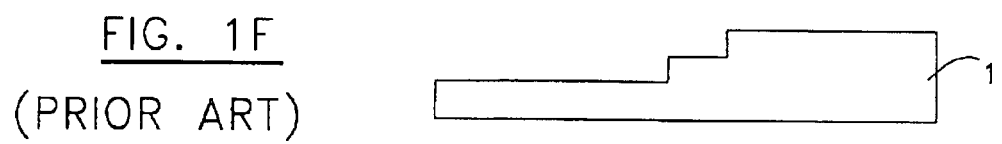

A binary mask photolithographic pattern transfer process known in the prior art is schematically shown in FIGS. 1A to 1F. In the first step, shown in FIG. 1A, the substrate layer 1 covered with a photoresist layer 2 is subjected to UV radiation through a first binary photomask 3. The step-like pattern from the photomask 3 is transferred into the UV radiation-sensitive photoresist layer 2. After pattern development, the step-like photoresist layer 2 will perform a function of the protective mask for, for example, etching of the substrate layer 1 by an ion-beam. This is illustrated in FIG. 1B. The residual photoresist layer 2 is typically completely consumed during the ion-beam etching process leaving substrate layer 1 selectively patterned in a step-like fashion. This is illustrated in FIG. 1C. Then, the whole photolithographic pattern transfer process is repeated using a second binary photomask 5 and a second photoresist layer 4 deposited on the substrate layer 1 as shown in FIG. 1D. A second etching step by an ion-beam follows leading to manufacturing of a double-step-like pattern in the substrate layer 1, as shown in FIG. 1E. The final result of the manufacturing process is shown in FIG. 1F.

Figures 2A, 2B, 2C:
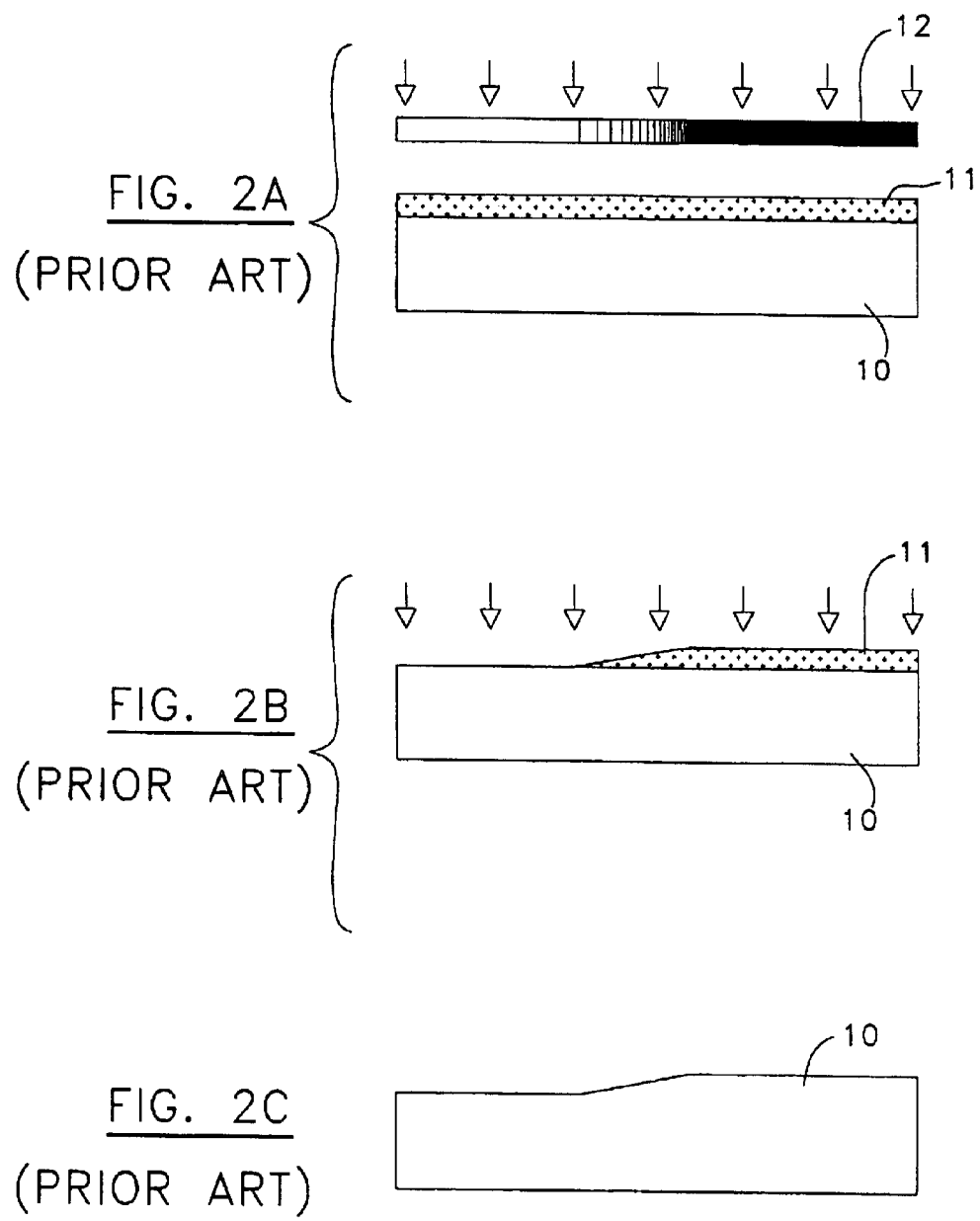
FIGS. 2A to 2C are schematic side views of the elements involved in each of the steps of a micropattern generation using a grey scale photomask. Such micropattern generation is known in the art.

The micropattern generation known in the prior art and using a grey scale photomask is schematically shown in FIGS. 2A to 2C. In the first step shown in FIG. 2A, a photoresist film 11 is deposited on a selected substrate layer 10 typically by a spin coating technique. The photoresist film 11 is photoexposed through a grey scale mask 12 containing three-dimensional pattern information. This pattern information represents a sloped surface. Subsequently, as shown in FIG. 2B, the pattern created in the photoresist film 11 by the photoexposure through the grey scale mask 12 is developed. A sloped surface is created in the thickness of the photoresist film 11 and a selected dry or wet etching technique is being used to transfer the pattern from the photoresist film 11 into the substrate layer 10. The dry etching technique uses, for example, an ion-beam. Typically the photoresist film 11 will be totally consumed during the etching process leaving the substrate layer 10 with the etched sloped pattern originally contained in the grey scale mask used, as shown in FIG. 2C.

Figure 3:
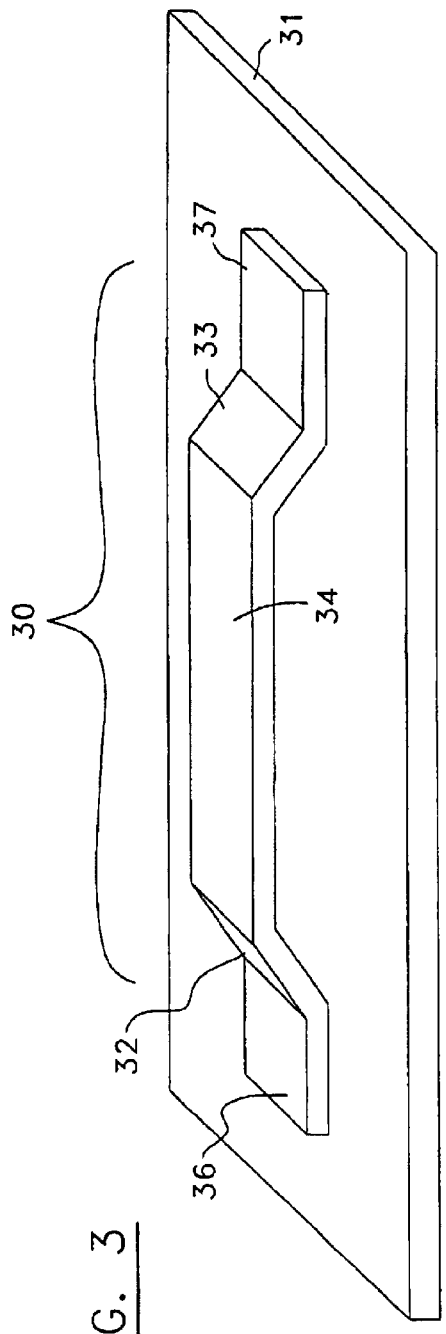
FIG. 3 is a perspective view of a suspended microstructure fabricated by the method according to the present invention.
Figure 4:
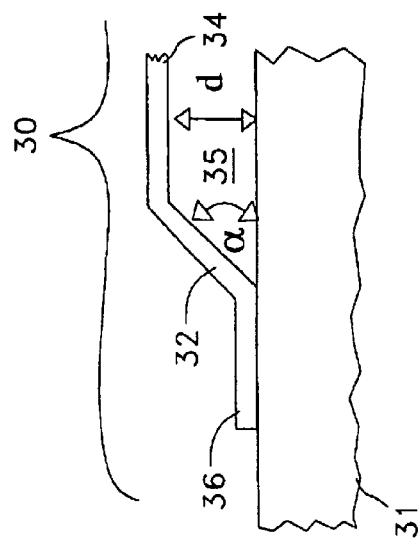
FIG. 4 is a partial side view of a portion of the suspended microstructure shown in FIG. 3.

The object of the present invention is an application of the grey scale mask technique to efficient and flexible manufacturing of three-dimensional suspended microstructures equipped with sloped support members. Two examples of such microstructures are schematically shown in FIGS. 3, 4, 6 and 7. These microstructures are: microbeams, as shown in FIGS. 3 and 4, and microplatforms, as shown in FIGS. 6 and 7. Other forms of suspended microstructures equipped with sloped support members, as well as combinations of microbeams and microplatforms are also possible. All these suspended microstructures are building blocks of several microdevices such as sensors of radiation, temperature, pressure, flow, chemical and biological species, emitters of radiation and others. These microdevices are classified as Micro Electro Mechanical Systems (MEMS), Micro Opto Electro Mechanical Systems (MOEMS) or simply Micro Systems (MS). The suspended microstructures equipped with sloped support members may also be part of electronic Integrated Circuits (ICs).

Referring now to FIGS. 3 and 4, there is shown a suspended microbeam 30 produced on a substrate layer 31. The suspended microbeam 30 consists of sloped support members 32 and 33, a horizontal section 34 suspended over on air gap 35, and two landing pads 36 and 37. This microbeam 30 is manufactured using the process flow schematically shown in FIGS. 9A to 9E.

Utilization of the grey scale mask, as proposed in this invention, allows obtaining the suspended microbeam 30 equipped with the horizontal section 34 suspended over the substrate layer 31 at a predetermined distance d, and also equipped with the sloped support members 32 and 33 positioned at a precisely defined angle a with respect to the substrate layer 31, as shown more specifically in FIG. 4. For a determined distance d between the horizontal section 34 and the substrate layer 31, the inclination angle a of the sloped members 32 and 33 determines mechanical and electromechanical properties of the microbeam 30. A precise control over the angle α permits precise control over these mechanical and electromechanical properties of the microbeam 30.

Figure 5:
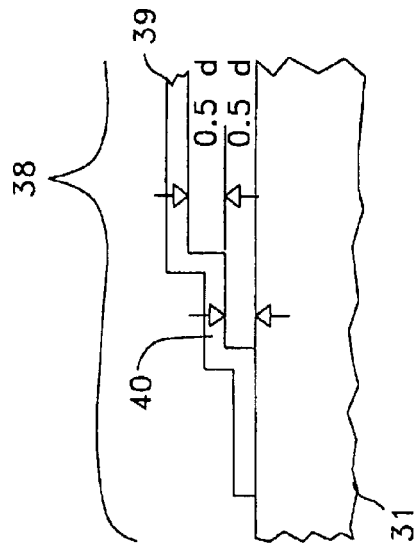
FIG. 5 is a partial side view of a suspended microstructure fabricated by a method of the prior art.

Referring now to FIG. 5, there is shown a suspended microbeam manufactured by a binary mask technique of the prior art. The microbeam 38 is equipped with a horizontal section 39 and step-like members 40. Mechanical and electromechanical properties of this microbeam 38 would depend on the number of steps in the step-like members 40 and thus on the number of binary masks used. A very large number of the binary masks would have to be used to obtain the members 40 resembling the sloped members 32 and 33. Multiple repetitions of the photoresist deposition and development, as well as etching steps would be required.

Referring now to FIG. 6, there is shown a different microstructure, namely a suspended microplatform structure 50. The microplatform structure 50 consists of a platform 51 supported by sloped support members 52 and 53 over the surface of a substrate layer 54. This suspended microplatform structure 50 is manufactured by applying the grey scale mask technique and the corresponding process flow schematically shown in FIGS. 10A to 10G. The platform 51 is separated from the substrate layer 54 by a defined distance d. The sloped support members 52 and 53 are positioned at a precisely determined angle α with respect to the substrate layer 54, as shown in FIG. 7. A precise control over the angle α permits precise control over the mechanical properties of the suspended microplatform 50.

Referring now to FIG. 8, there is shown a suspended microplatform 55 manufactured by a binary mask technique of the prior art. This structure 55 consists of a platform 56 supported by support members 57 over the surface of a substrate layer 54. The support members 57 are step-like cantilever structures. The number of steps depends on the number of binary masks used, which influences a complexity of the manufacturing process.

Figure 9A:
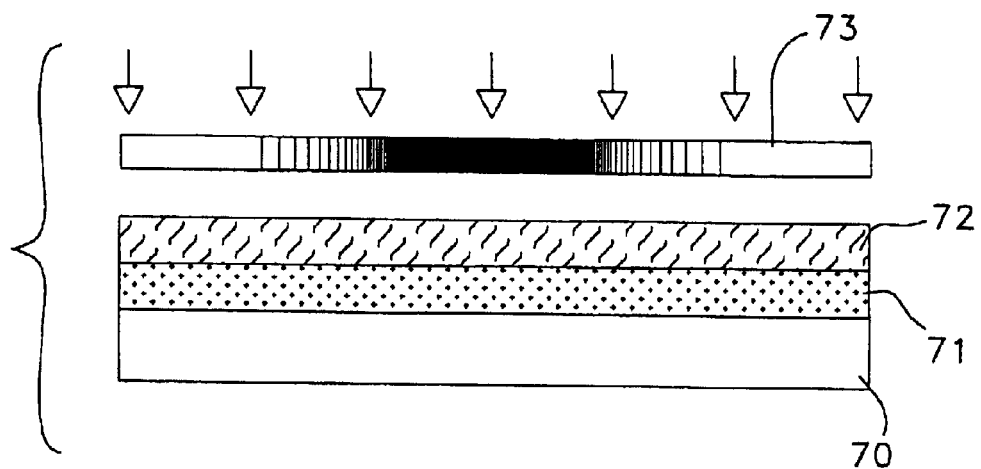
FIGS. 9A to 9E are schematic side views of the elements involved in each of the steps of a method according to the present invention.
Figure 9B:
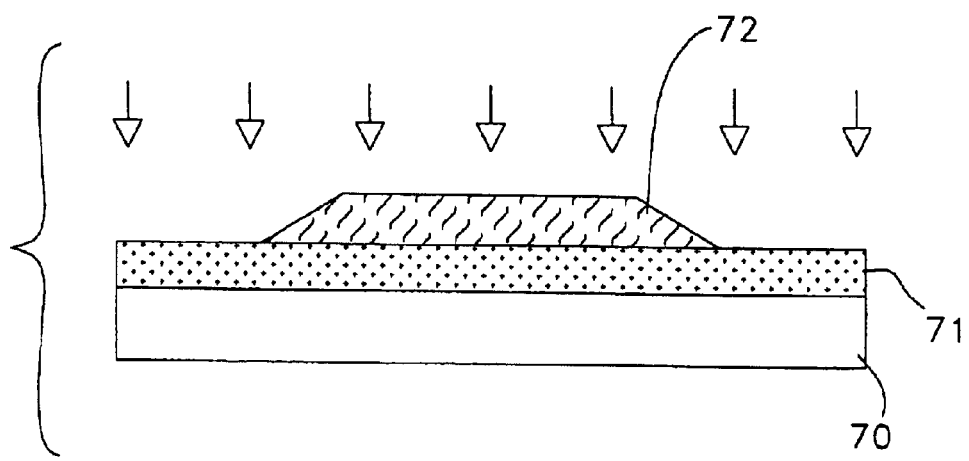
Figure 9C:
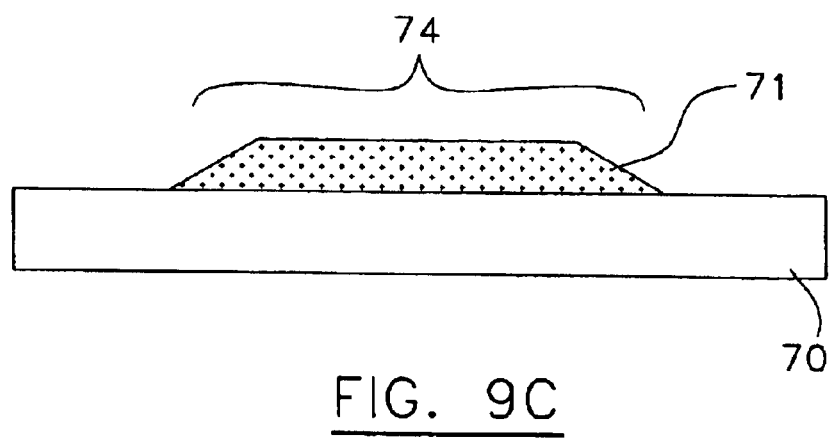
Figure 9D:
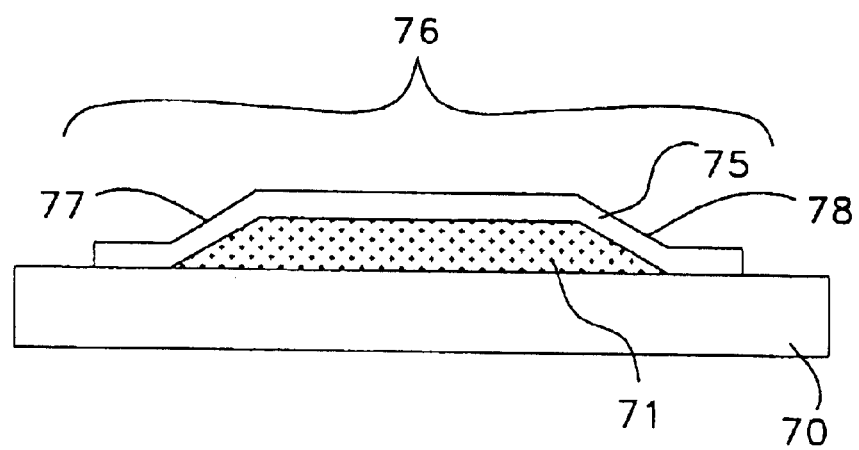
Figure 9E:
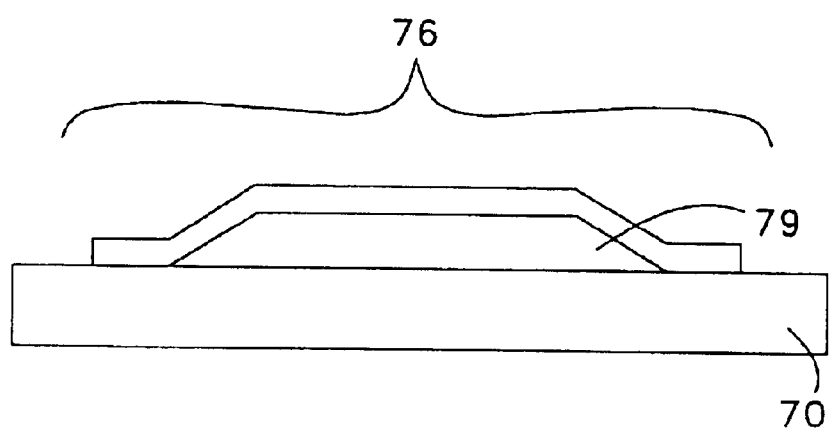

FIGS. 9A to 9E schematically show a process flow making use of a single grey scale mask for manufacturing of the suspended microbeam structure illustrated in FIGS. 3 and 4. The method of fabricating a suspended microstructure with a sloped support, comprising the steps of (a) providing a member having three stacked up layers including a first substrate layer 70, a second temporary layer 71 and a third photoresist layer 72, and (b) photolithographically transferring a sloped pattern to the third photoresist layer 72 by means of a grey scale mask 73, as shown in FIG. 9A. Then the method comprises a step of (c) etching the second layer 71 through the third layer 72 resulting from step (b) to obtain a surface with at least one continuous slope having a predetermined angle with respect to the first substrate layer 70, as shown in FIGS. 9B and 9C. The method also comprises steps of (d) depositing a fourth layer 75 on the previous layers, and (e) etching the fourth layer 75 to obtain the sloped support as shown in FIG. 9D. Finally, the method comprises a step of (f) removing the second layer 71 to obtain the suspended microstructure with the sloped support, as shown in FIG. 9E.

Preferably, the etching of step (c) is performed in such a way that the surface that is obtained includes a plateau with two opposite continuous slopes each having a predetermined angle with respect to the first substrate layer 70, as shown in FIG. 9C. Also preferably, the predetermined angles are substantially equal but they can be different.

According to the preferred embodiment shown in FIGS. 9A to 9E, the photoresist layer 72 is subjected to UV radiation through a grey scale mask 73 carrying a coded pattern of the microbeam structure equipped with sloped support members, as shown in FIG. 9A. The pattern from the grey scale mask 73 is transferred into the photoresist layer 72 which, after development, will serve as a masking layer for dry etching, for example ion-beam etching, of the second layer 71, as shown in FIG. 9B. The selective dry etching of the sacrificial layer 71 leads to generation of a sloped-wall pattern 74 into the second layer 71, as shown in FIG. 9C. In the next manufacturing step, shown in FIG. 9D, the microbeam structural material in the form of the fourth layer 75 is deposited as a thin film by, for example, plasma-enhanced chemical vapor deposition (PECVD) technique, and then reticulated by, for example, a dry etching technique, to form the microbeam structure 76 equipped with sloped support members 77 and 78, as shown in FIG. 9D. The microbeam structure 76 shown in FIG. 9D rests on the second layer 71. In the last manufacturing step shown in FIG. 9E, the second layer 71 is removed by, for example, a plasma isotropic etching technique or a wet etching technique, and the microbeam structure 76 is freed and thus partially suspended over the substrate layer 70. An air gap 79 separates a part of the suspended microbeam structure 76 from the substrate layer 70.

Figure 10A:
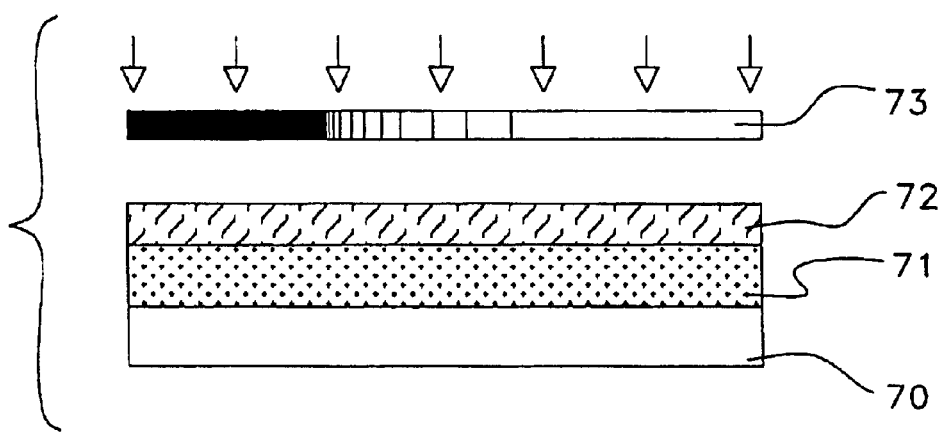
FIGS. 10A to 10G are schematic side views of elements involved in each of the steps of another method according to the present invention.
Figure 10B:
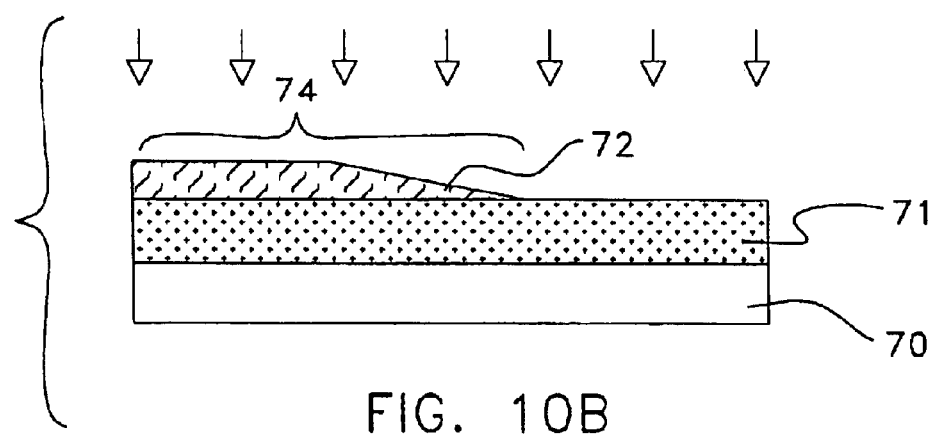
Figure 10C:
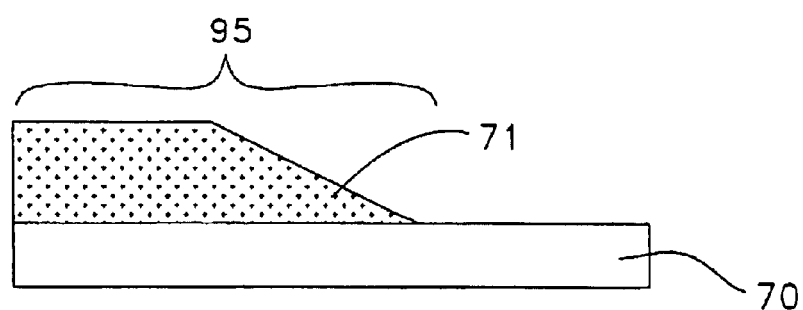
Figure 10D:
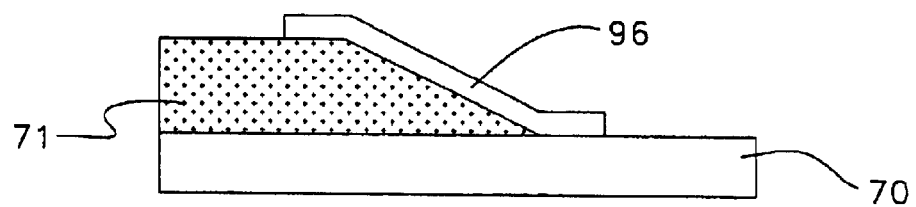
Figure 10E:
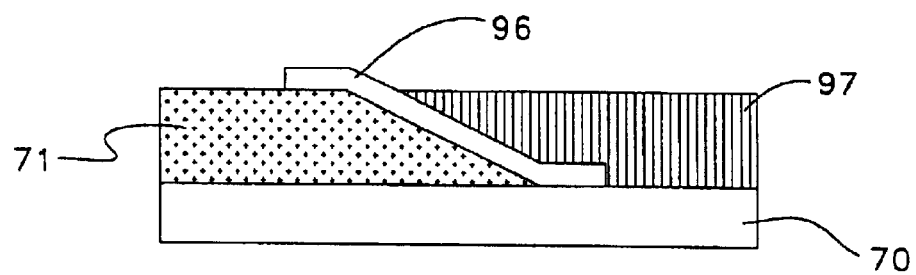
Figure 10F:
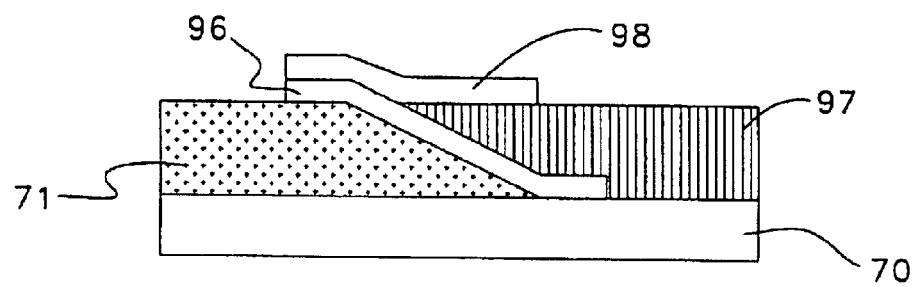
Figure 10G:
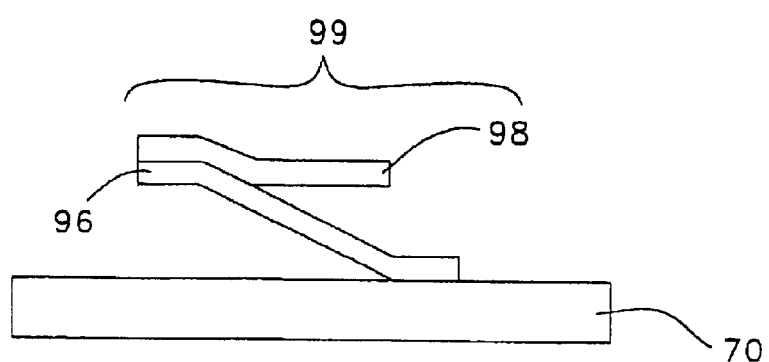

According to another preferred embodiment, FIGS. 10A to 10G schematically show a single grey scale mask-based process flow leading to manufacturing of the suspended microplatform microstructure shown in FIGS. 6 and 7. FIG. 10A shows a substrate layer 70 covered with a second layer 71, which is a sacrificial layer, which in turn is covered with a photoresist layer 72. The photoresist layer 72 is subjected to UV radiation through a grey scale mask 73. This grey scale mask 73 carries a coded image of sloped support members. The sloped pattern 74 from the grey scale mask 73 is transferred into the photoresist layer 72 which will serve as a mask for selective dry etching of the sacrificial layer 71, as shown in FIG. 10B. The selective dry etching of the sacrificial layer 71 leads to generation of a sloped pattern 95, as shown in FIG. 10C. In the next manufacturing step shown in FIG. 10D, the sloped supporting members 96 are produced by a combination of the thin film deposition technique such as PECVD and the dry etching reticulation technique. In the next manufacturing step shown in FIG. 10E, a planarization layer 97 is deposited. In the step shown in FIG. 10F, the microplatform 98 is produced by a combination of the thin film deposition technique such as PECVD and the dry etching reticulation. In the last step shown in FIG. 10G, both the sacrificial layer 71 and the planarization layer 97 are removed by the plasma isotropic etching technique or a wet etching technique. The microplatform structure 99 consisting of the microplatform 98 and the sloped support members 96 is then suspended over the surface of the substrate layer 70, as shown in FIG. 10G.

In the process flows illustrated in FIGS. 9A to 9E and 10A to 10G, the following thin film materials could be used: dielectrics such as $SiO_2$, $Si_3N_4$, metals such as Ti, Al, V, Au and semiconductors Si for the microstructure materials, and polymers such as polyimide, or glasses for the sacrificial layer materials. The thin film deposition could be performed making use of the already mentioned PECVD technique but also by the techniques of sputtering, resistive evaporation or electroplating. The thin film etching could be performed by the dry etching techniques such as reactive ion etching (RIE) technique or the wet etching technique making use of various liquid etchants known to the skilled in the art. The planarization layer is made of a polymer such as polyimide, or made of glass.

In conclusion, the proposed application of the grey scale mask technique to manufacturing of suspended microstructures offers the following advantages over the application of the standard binary mask technique:

- a unique possibility of manufacturing suspended microstructures equipped with sloped support members with distinctive mechanical, electromechanical and other physical properties;
- a significant reduction in the number of manufacturing steps including mask generation, photolithographic pattern transfer, photoresist deposition and development and dry or wet etching sequences; and
- a reduction in manufacturing time and cost.

Although the present invention has been explained here and above by way of preferred embodiments thereof, it should be pointed out that any modifications to these preferred embodiments within the scope of the appended claims is not deemed to alter or change the nature and scope of the present invention.

What is claimed is:

1. A method of fabricating a suspended microstructure with a sloped support, comprising the steps of:
   (a) providing a member having three stacked up layers including a first substrate layer, a second temporary layer and a third photoresist layer;
   (b) photolithographically transferring a sloped pattern to the third photoresist layer by means of a grey scale mask;
   (c) etching the second layer through the third layer resulting from step (b) to obtain a surface with at least one continuous slope with a predetermined angle with respect to the first substrate layer;
   (d) depositing a fourth layer on the previous layers;
   (e) etching the fourth layer to obtain the sloped support;
   (i) depositing a fifth planarization layer for covering the previous layers except for a top portion of the sloped support;
     (ii) depositing a sixth layer on the previous layers; and
     (iii) etching the sixth layer to obtain a suspended microplatform;
   (g) removing the second layer and the fifth layer to obtain the suspended microstructure with the sloped support.

2. A method according to claim 1, wherein:
   the etching of step (c) is performed in such a way that the surface that is obtained includes a plateau with two opposite continuous slopes each having a predetermined angle with respect to the first substrate layer.

3. A method according to claim 2, wherein the predetermined angles are substantially equal.

4. A method according to claim 1, wherein the depositing of step (d) is performed by means of a plasma-enhanced chemical vapor deposition technique.

5. A method according to claim 1, wherein the removing of the second in layer step is performed by means of a plasma isotropic etching technique or a wet etching technique.

6. A method according to claim 1, wherein the removing of the fifth layer in step (g) is performed by means of a plasma isotropic etching technique or a wet etching.

7. A method according to claim 1, wherein the fourth layer of step (d) is made of a material selected from the group including $SiO_2$, $Si_3N_4$, Ti, Al, V, Au and Si.

8. A method according to claim 1, wherein the depositing of step (d) is performed by means of a technique selected from the group including sputtering technique, resistive evaporation technique and electroplating technique.

9. A method according to claim 1, wherein the etching of step (c) or (e) is performed by means of a reactive ion etching technique or a wet etching technique.

10. A method according to claim 1, wherein the depositing of step (ii) is performed by means of a plasma-enhanced chemical vapor deposition technique.

11. A method according to claim 1, wherein the second temporary layer of step (a) is made of a polymer or made of glass.

12. A method according to claim 11, wherein the polymer is polyimide.

13. A method according to claim 1, wherein the fifth planarization layer of step (i) is made of a polymer or made of glass.

14. A method according to claim 13, wherein the polymer is polyimide.

15. A method according to claim 1, wherein the sixth layer of step (ii) is made of a material selected from the group including $SiO_2$, $Si_3N_4$, Ti, Al, V, Au and Si.

16. A method according to claim 1, wherein the depositing of step (ii) is performed by means of a technique selected from the group including sputtering technique, resistive evaporation technique and electroplating technique.

17. A method according to claim 1, wherein the etching of step (iii) is performed by means of a reactive ion etching technique or a wet etching technique.

* * * * *